United States Patent
Lee

(10) Patent No.: US 6,678,334 B1
(45) Date of Patent: Jan. 13, 2004

(54) METHODS OF REDUCING THE COMPLEXITY OF TRELLIS-BASED SCALAR-VECTOR QUANTIZERS

(75) Inventor: Cheng-Chieh Lee, Basking Ridge, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/460,468

(22) Filed: Dec. 14, 1999

(51) Int. Cl.[7] .............................. H04L 5/12; H04L 27/36
(52) U.S. Cl. ........................................ 375/265; 375/298
(58) Field of Search ................................. 375/261, 265, 375/285, 296, 298, 240.03, 243, 245, 286; 714/792

(56) References Cited

U.S. PATENT DOCUMENTS 5,297,170 A * 3/1994 Eyuboglu et al. ........... 375/242
5,388,124 A * 2/1995 Laroia et al. ................ 375/286
6,504,877 B1 * 1/2003 Lee ............................. 375/265

* cited by examiner

Primary Examiner—Young T. Tse
Assistant Examiner—David B. Lugo

(57) ABSTRACT

Methods of a reducing the complexity of Trellis-Based Scalar-Vector Quantizer (TB-SVQ) includes the initial step of defining an unbounded set of reproduction symbols in which neighboring symbols are distanced from each other by a predetermined factor. The set of the representation symbols is grouped into a region and a norm value is assigned to the region. A threshold value for the norm is then determined and the region is bound to an element in the region with respect to the norm of the region. A region parameter is then determined as a function of the norm of the region to minimize the shape gain of the region and to thereby reduce the complexity of the TB-SVQ for the source and optimally shape a constellation associated with the region. The inventive methods achieve a shaping gain of substantially 1.53 dB which is the theoretical limit of shaping gain. Thus, these methods optimally shape the constellation and achieve highly efficient data transmission.

5 Claims, 3 Drawing Sheets

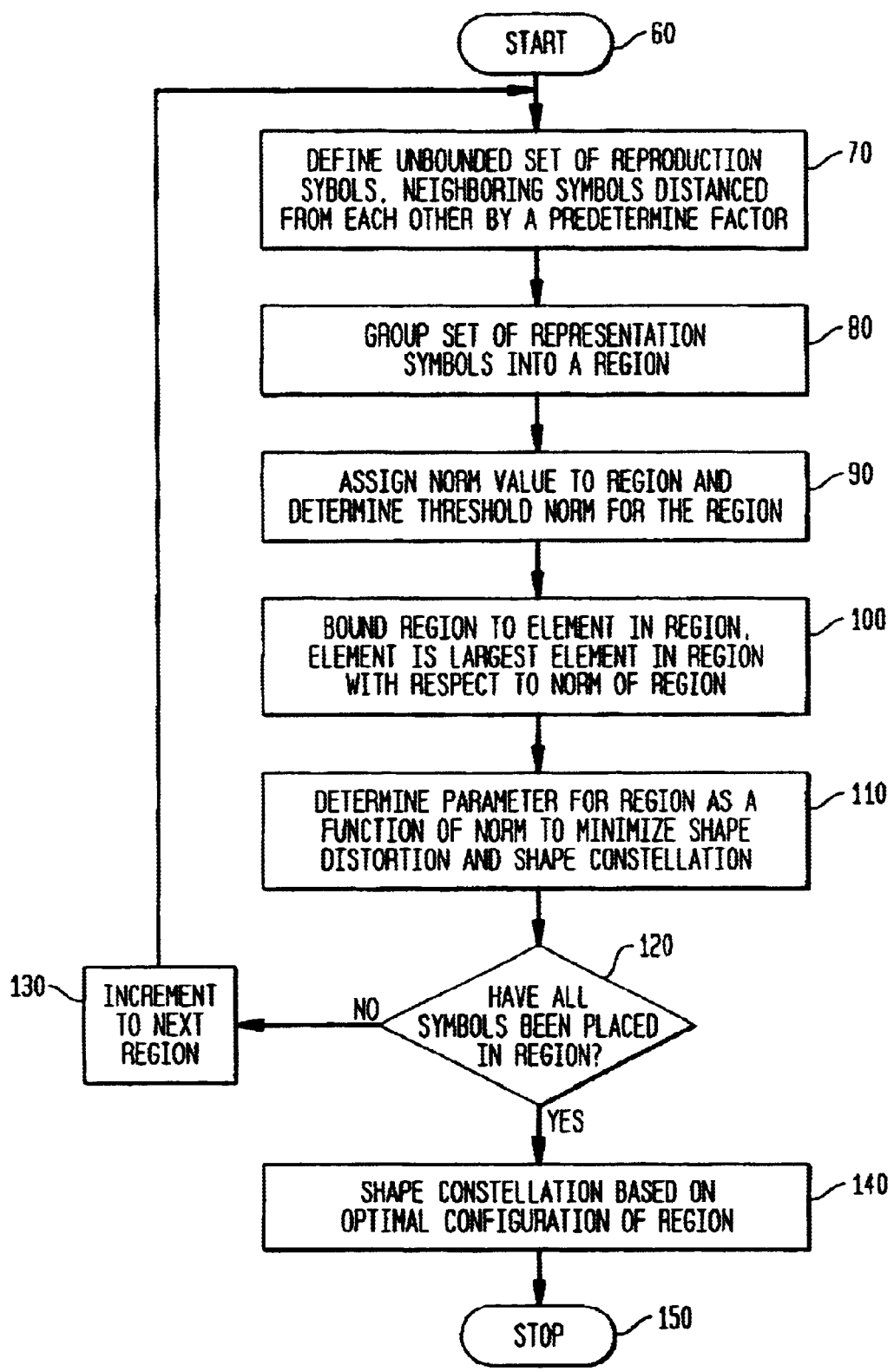

FIG. 3A

| RATE (BITS/ SAMPLE) | m-SPHERE | | | m-PYRAMID | | |
|---|---|---|---|---|---|---|
| | 16 | 32 | 64 | 16 | 32 | 64 |
| 1 | 7 (0.01) | 12 (0.04) | 24 (0.00) | 5 (0.11) | 10 (0.05) | 20 (0.01) |
| 2 | 35 (0.02) | 64 (0.01) | 121 (0.00) | 19 (0.01) | 35 (0.01) | 67 (0.01) |
| 3 | 151 (0.00) | 272 (0.00) | 512 (0.00) | 46 (0.00) | 86 (0.00) | 165 (0.01) |

FIG. 3B

| SOURCE | | m=64 | | m=32 | | m=64 | |
|---|---|---|---|---|---|---|---|
| | $(r_0, r_1)$ | (2,0) | (1,1) | (2,0) | (1,1) | (2,0) | (1,1) |
| GAUSSIAN | SNR | 10.93 | 10.97 | 11.16 | 10.98 | 11.32 | 11.29 |
| | $t_e$ | 61.92 | 6.74 | 160.49 | 13.34 | 441.76 | 34.94 |
| | $\beta^*$ | 0.25 | 0.24 | 0.25 | 0.24 | 0.25 | 0.24 |
| LAPLACIAN | SNR | 10.97 | 10.17 | 11.32 | 10.87 | 11.58 | 11.31 |
| | $t_e$ | 52.80 | 5.85 | 174.68 | 15.73 | 618.75 | 51.14 |
| | $\beta^*$ | 0.24 | 0.25 | 0.24 | 0.25 | 0.24 | 0.25 |

FIG. 3C

| SOURCE | | m=16 | | | m=32 | | | m=64 | | |
|---|---|---|---|---|---|---|---|---|---|---|
| | $(r_0, r_1)$ | (3,0) | (2,0) | (1,1) | (3,0) | (2,0) | (1,1) | (3,0) | (2,0) | (1,1) |
| GAUSSIAN | SNR | 16.41 | 16.50 | 16.55 | 16.75 | 16.83 | 16.65 | 17.00 | 17.05 | 17.05 |
| | $t_e$ | 615.53 | 58.38 | 7.01 | 1665.30 | 149.90 | 13.80 | 4841.90 | 408.46 | 36.42 |
| | $\beta^*$ | 0.130 | 0.134 | 0.130 | 0.130 | 0.130 | 0.130 | 0.130 | 0.130 | 0.126 |
| LAPLACIAN | SNR | 16.17 | 16.27 | 16.86 | 16.86 | 16.79 | 16.34 | 17.14 | 17.19 | 16.95 |
| | $t_e$ | 291.37 | 45.99 | 1000.80 | 1000.80 | 144.18 | 16.86 | 3687.10 | 496.33 | 57.17 |
| | $\beta^*$ | 0.130 | 0.134 | 0.142 | 0.130 | 0.130 | 0.131 | 0.130 | 0.126 | 0.129 |

METHODS OF REDUCING THE COMPLEXITY OF TRELLIS-BASED SCALAR-VECTOR QUANTIZERS

BACKGROUND OF THE INVENTION

1. Field of the Invention

The present invention relates generally to methods of reducing the complexity of trellis-based scalar-vector quantizers. More specifically, the invention relates to methods for reducing the complexity of trellis-based scalar-vector quantizers by breaking a constellation of points into a set of regions having an optimal trellis scale.

2. Description of the Related Art

Modern data communication systems rely on structured vector quantization schemes wherein a set of data points in a transmitted message word is modeled as a constellation of points which is a subset of coded bits enclosed within a bounded region wherein each encoded bit is assigned an energy level according to its position in the constellation. A trellis-based scalar-vector quantizer (TB-SVQ) is a type of structured vector quantizer scheme that takes advantage of the fact that for a certain class of memoryless sources, the TB-SVQ can approach a rate-distortion limit, as for example a Gaussian or Laplacian distribution. The TB-SVQ technique is therefore quite useful for transmitting data over additive white Gaussian noise (AWGN) channels which are typical data channels for the Internet or, indeed, over any transmission system using modems or other direct data lines such as digital subscriber lines (DSL), T1 lines or other high-speed data links.

In order to achieve efficient data transmission, prior art transmission methods have engaged in constellation shaping so that the data channels are transmitted with low loss and low intersymbol interference. It has long been a goal in designing high-speed data systems to minimize the average transmission power for AWGN channels, and so it has generally been desirable to ensure that the constellation boundary be made as spherical as possible. This has resulted in the introduction of the "shaping gain" parameter which, as a consequence of its mathematical definition is known to those skilled in the art, has been found to have an upper limit of 1.53 dB. A goal of communication engineers has been to come as close to realizing the 1.53 dB upper limit of the shaping gain when designing modern, high-speed data transmission systems.

One prior art method for achieving most of the 1.53 dB shaping gain is to partition the points in a two-dimensional (2D) constellation into a small number of equal area regions, usually circular shells wherein points having the same probability are partitioned into the region. See A. Calderbank and L. Ozarow, "Nonequiprobable Signaling on the Gaussian Channel," IEEE Trans. Inform. Theory, Vol. IT-36, pp. 726–740 (July 1990), the teachings of which are expressly incorporated herein by reference. Using this method, it is possible to achieve a close to spherical boundary in the higher dimensional space by employing a good shape code to provide the desired nonequiprobable signaling or selection of sequences of these regions. However, this method is not practical since it always requires a large number of points for effective partitioning to occur which is oftentimes not practical since the encoded data bits do not fill the constellation adequately.

Prior encoding techniques also have tended to be codebook-based in that they require a stored table or memory of codes which can be compared against current incoming data to reconstruct the data word after transmission. Since a memory of codes is used in these systems they are inherently accurate in reproducing the data word, but much slower and less robust than systems that utilize memoryless sources. However, other prior art systems have extended the TB-SVQ scheme to effectively solve the excitation codebook search problem embedded in code excited linear prediction (CELP) speech coders in an effort improve the speed of such systems while maintaining the reliability achieved with the use of a codebook. See C. C. Lee and R. Laroia, "Trellis Code Excited Linear Prediction (TCELP) Speech Coding." Bell Labs Technical Memorandum 11332-981030-26TM.

Yet other approaches have been developed to shape the constellation and achieve an optimal m-sphere codebook boundary in an m-dimensional space. See U.S. Pat. No. 5,388,124, PRECODING SCHEME FOR TRANSMITTING DATA USING OPTIMALLY-SHAPED CONSTELLATIONS OVER INTERSYMBOL-INTERFERENCE CHANNELS, Laroia et al., the teachings of which are expressly incorporated herein by reference. The methods of the Laroia et al. patent utilize a structured vector quantizer denoted the "scalar-vector quantizer" (SVQ) which produces an optimal shaping scheme called SVQ shaping. Unfortunately, this scheme is computationally complex since the computation and storage requirements for indexing SVQ code-vectors is dense, making implementation of the SVQ shaping method impractical for commercial devices.

Accordingly, there is a long-felt, but unresolved, need in the art for methods of constellation shaping which produce optimally shaped constellations for data word transmission and reproduction. These methods should be robust and should be particularly applicable to memoryless (non-codebook based) quantizers, as for example the TB-SVQ. Moreover, the methods should reduce the signal complexity of the quantizers efficiently and without dominating computer processor resources. Such needs have not heretofore been met in the art.

SUMMARY OF THE INVENTION

The aforementioned problems are solved, and long felt needs met, by methods of the present invention for reducing constellation complexity of TB-SVQs for memoryless data sources in a communication system. The methods preferably comprise the steps of defining an unbounded set of reproduction symbols in which neighboring symbols are distanced from each other by a predetermined factor, and grouping the set of representation symbols into a region. It is then desired to assign a norm value to the region and to determine a threshold norm value for the region. The region is then bound to an element in the region which is the largest element in the region with respect to the norm of the region. A parameter for the region is then determined, as a function of the norm of the region, that minimizes shape distortion of the region, thereby reducing the complexity of the TB-SVQ for the source and optimally shaping the constellation.

The inventive methods of reducing the complexity of TB-SVQs by signaling of regions greatly reduce the computational complexity of prior constellation shaping regimens. By employing the inventive methods, a shaping gain of about 1.53 dB can be achieved which is the theoretical upper limit of the shaping gain. Thus, the constellation can be optimally shaped and data transmission efficiently achieved. Such results have not heretofore been achieved in the art.

These and other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote like elements throughout the several views:

FIG. 2 depicts an exemplary flow chart of a method for reducing the complexity of TB-SVQ by signaling of regions in accordance with the invention; and FIGS. 3A, 3B and 3C depict simulated results for the methods of the present invention, wherein FIG. 3A depicts the threshold norm for an m-sphere or an m-pyramid, FIG. 3B depicts the rate-distortion at 2 bits/sample, and FIG. 3C depicts the rate-distortion at 3 bits/sample.

DETAILED DESCRIPTION OF THE PRESENTLY PREFERRED EMBODIMENTS

Figure 1A:
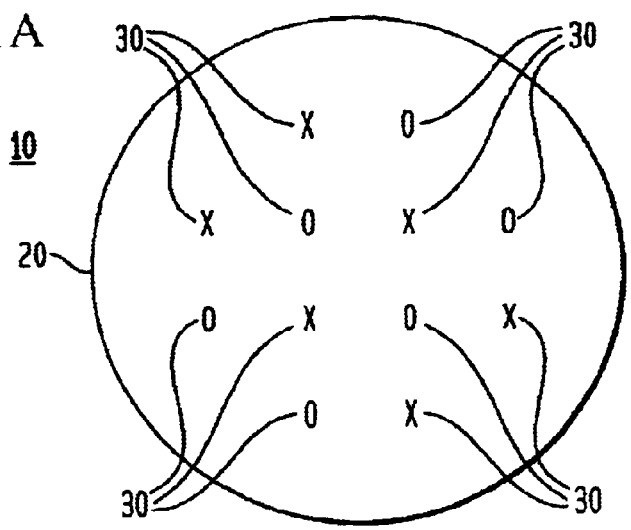
FIG. 1A depicts by way of example a signal constellation wherein individual data bits are mapped to the constellation in a two-dimensional (2D) energy space.

FIG. 1 depicts an exemplary data signal constellation 10 which is used to transmit digital data over narrow band and wide band channels such as voice-based telephone lines or wireless links. The constellation 10 is essentially an energy map in which the individual data bits of a data word are placed according to an assigned energy level. This creates a 2D energy space in which the individual bits (x's and o's in the energy space of FIG. 1) are characterized by their respective positions in the constellation. Constellation 10 generally comprises a boundary 20 within which the several constellation points or data bits 30 are mapped. Since the individual bits are characterized according to their energy levels and are so plotted, they experience various effects associated with transmission such, for example, as energy distortion, amplitude response rolloff and envelope distortion at the upper and lower band edges of the constellation. Moreover, as higher bandwidths and data rates are achieved in modern communication systems, more points are added to the constellation which further tends to distort the signal.

In order to overcome these problems, techniques have been developed in the past which manipulate the constellation to achieve optimal transmission results. These techniques are commonly referred to as "constellation shaping" techniques or methods and they generally require a reduction in the transmitted signal power for a fixed minimum distance between constellation points. By shaping the constellation in this manner, more reliable data transmission over channels that have been corrupted by white or Gaussian noise can be achieved.

The TB-SVQ can be characterized by a codebook structure having a reproduction alphabet Q and a trellis code T(Q) defined by partitioning Q into subsets and using these subsets to label transitions in a trellis diagram. Thus, a TB-SVQ is a quantizer that functions on discrete energy levels rather than on a continuous energy plane. This allows the TB-SVQ to be more readily manipulated and allows data transmission to occur more smoothly as compared to other kinds of quantizers. While the present invention has been described with respect to TB-SVQs, it will be recognized by those skilled in the art that other types of quantizers may be amenable to the methods of the present invention and that all such quantizers are within the scope of the present invention. For exemplary purposes, and without intending to limit the invention in any way, the inventive methods will be described throughout with respect to TB-SVQs.

A sequence $c_i$ (which is a member of Q) is a code-sequence of T(Q) if the corresponding sequence of subsets addresses a continuous path in the trellis diagram. The TB-SVQ codebook is a subset of code-sequences $\{c_i\}$ of T(Q) with the additional constraint that when $\{c_i\}$ is partitioned into m-vectors, each m-vector will lie inside a proscribed codebook boundary. Thus, in accordance with the invention the TB-SVQ can be implemented to quantize an otherwise memoryless source such as a Gaussian or Laplacian source. Similarly, the inventive methods are applicable to any memoryless source, but will for convenience and by way of example be described throughout with respect to Gaussian or Laplacian sources.

Since Gaussian source distributions are symmetric, the Q alphabet is assumed to be defined as $\{+/-q_i: i=1, 2, \ldots, n\}$ and can be partitioned into two subsets $Q_A$ and $Q_B$ by assigning a rightmost level $q_n$ to one subset, assigning the following level $q_{n-1}$ to the other subset, and so forth alternately until the leftmost level $-q_n$ is assigned. Accordingly, both $Q_A$ and $Q_B$ have n levels and every level $q_i$ in $Q_A$ can be paired with a distinct $-q_i$ in $Q_B$.

In a preferred embodiment, the underlying trellis code T(Q) is an Ungerboeck's 1D rate-½ code as described in G. Ungerboeck, "Channel Coding with Multilevel/Phase Signals," IEEE Trans. Inform. Theory, vol. IT-28, pp. 55–67 (January 1982), the teachings of which are expressly incorporated herein by reference. This T(Q) assumes that all outgoing branches of each trellis state are collectively labeled exclusively by $Q_A$ or $Q_B$, which means that all permissible reproduction symbols for an input source sample are either in $Q_A$ or $Q_B$ and are dictated by the trellis state. Thus, a code sequence $\{c_i\}$ of T(Q) can be mapped to a sequence $\{d_i$ a member of $Q^+)$ where $Q^+$ is defined as $\{q_i: i=1, 2, \ldots, n\}$ and $d_i=|c_i|$.

The optimal codebook boundary in the mD space for memoryless Gaussian distributions is an m-sphere which can be implemented by assigning for each symbol $q_i$ a member of $Q^+$ and an $L_2$ norm, as for example, $l_i=q_i^2$. A block of m samples in $\{d_i\}$ then lies inside the codebook if its cumulative $L_2$ norm is no greater than the norm of the radius of the codebook sphere, denoted by L. This threshold is determined as the largest norm such that the codebook sphere contains no more that $2^{mr}$ code-vectors, where r is the coding rate in bits/sample.

For memoryless Laplacian sources, the optimal codebook boundary is a pyramid which can be similarly implemented provided that an $L_1$ norm is assigned to every $q_i$ which is a member of $Q^+$ and the codebook is a pyramid. For sources whose probability density functions are not explicitly known, the set of norms L has members $\{l_1, l_2, \ldots, l_n\}$ and the threshold norm L can be designed using a generalized Lloyd algorithm as taught in the aforementioned Laroia et al. publication.

Utilizing the above foundations for TB-SVQ constellation shaping, the inventive methods are able to greatly reduce the codebook search complexity and data storage requirements for data transmission and to index the code vectors in communication systems since the storage requirements will depend only linearly on the threshold norm L[1, 2]. By effectively reducing L without sacrificing the rate-distortion performance for a given m, the implementation complexity of the TB-SVQ can be reduced. In this manner, the inventive methods effectively create a codebook for memoryless sources which is optimal for data transmission from the source to its intended destination. This allows for optimal constellation shaping and the achievement of nearly the entire 1.53 dB shaping gain. Such results have not heretofore been achieved in the art.

Figure 1B:
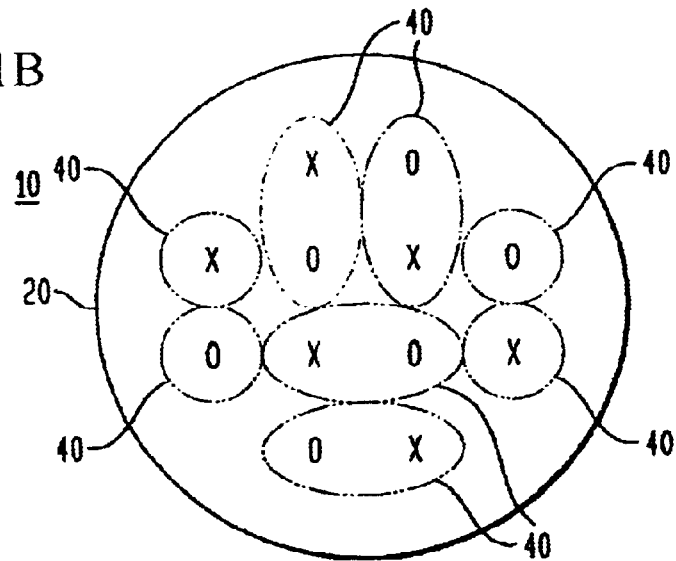
FIG. 1B depicts the 2D constellation of FIG. 1A wherein the energy space has been subdivided into eight regions to achieve constellation shaping in accordance with the methods of the present invention.

The present invention implements the results detailed in A. Calderbank and L. Ozarow, "Nonequiprobable Signaling on the Gaussian Channel," IEEE Trans. Inform. Theory, vol. IT-36, pp. 726–740 (July 1990), the teachings of which are expressly incorporated herein by reference. In accordance with the teachings of Calderbank et al., it should be possible to achieve most of the boundary shaping gain by partitioning the SVQ alphabet into a small number of equal area regions and shaping the codebook boundary based on a desired signaling, i.e. a selection of sequences, of these regions. Referring to FIG. 1B, a graphical depiction of this method is shown wherein the codebook boundary region, the boundary 20 of constellation 10, is subdivided into eight spherical regions 40 each containing points 30 in the constellation. While eight regions 40 have been depicted in FIG. 1B, any number of regions may be defined by subdivision. It has been found that in most situations, subdividing the constellation into no more than sixteen regions is sufficient to achieve the maximum 1.53 dB shaping gain desired.

To accomplish this result, set the "quantization rate" r to $r_0+r_1$ bits per sample, where $r_0$ bits/sample is the bit rate dedicated to shape the codebook boundary and the remaining $r_1$ is an integer greater than or equal to zero. Starting from the least magnitude non-negative symbol, every consecutive $2^{r_1}$ symbols are grouped into a region $q_i$ for i=1, 2, . . . , n. Then, redefining $Q^+$ as $\{q_1, q_2, \ldots, q_n\}$ and assigning each region $q_i$ a norm $l_i$, the threshold norm L is determined as the largest norm such that the codebook contains no more than $2^{mr_0}$ code-vectors. Subject to this codebook structure, each TB-SVQ m-vector is indexed by an mr bit-codeword of $mr_0$ bits index, an SVQ vector in $Q^{+m}$ which corresponds to m-regions, and $mr_1$ bits explicitly specify those m symbols in the prescribed sequence of regions.

Figure 1C:
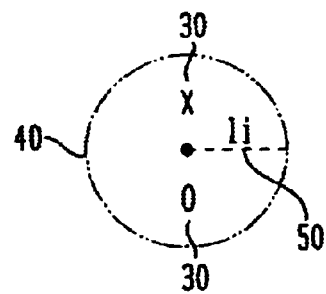
FIG. 1C depicts an exemplary region from the multiple regions shown in FIG. 1B.

FIG. 1C depicts an exemplary region 40 having a norm $l_i$ shown at 50 and which is the maximum norm for the region. The exemplary region 40 is a circle, or a sphere in 3D, and so norm $l_i$ 50 is the radius of the circle or sphere. It will be recognized by those skilled in the art that shapes other than a circle or sphere could be used to build the regions, in which case the maximum norm would be not the radius of the circle but, instead, may be an arbitrary number. Circular region 40 contains two constellation points 30 from which other norms may be taken. In a preferred embodiment, all of the symbols in region 40 are allowed to contribute an identical norm $l_i$ and therefore compete only in the cumulative distortion of the signal.

It will be further recognized by those skilled in the art that the methods of the present invention may be practiced on a digital computer operable to execute a software program that embodies algorithms implementing the invention. Alternatively, a microprocessor embedded in a device containing the source may be programmed with the algorithms, or the algorithms may be placed in firmware and executed by an application specific integrated circuit or a digital signal processor chip. All such embodiments are intended to be within the scope met contemplation of the present invention.

Referring to FIG. 2, a flow chart of a preferred form of the methods of the present invention, which can be implemented in software, is depicted. The method starts at 60 for the Gaussian or Laplacian memoryless source whose optimal codebook boundaries can be characterized. At step 70 an unbounded set of reproduction symbols, Q, defined as $\{+/-(2i-1)\beta: i=1, 2, \ldots\}$, is obtained for which neighboring symbols are distanced from each other by a predetermined factor. In a preferred embodiment, the predetermined factor is $2\beta$ wherein $\beta$ is a factor that minimizes distortion and is empirically determined by plotting the quantizer distortion on an encoding zero-mean unit-variance source sequence as a function of $\beta$. At step 80, the set of representation symbols are grouped into a region as follows:

$$q_i = \{(2((i-1)2^{r_1}+j)-1)\beta: j=1, 2, \ldots, 2^{r_1}\}, \text{ for } i=1, 2, \ldots$$

At step 90, a norm value is assigned to the region and a threshold norm is determined for the region. For a Gaussian source, the desired codebook has an m-sphere boundary. This can be implemented by assigning to every region $q_i$ an $L_2$ norm$^2$ of $l_i=(i-2)i/2$. For a Laplacian source, the optimal codebook boundary is an m-pyramid and can be implemented by assigning an $L_1$ norm of $l_i=(i-1)$. To determine the threshold norm L of the region, one determines the largest integer such that the SVQ with the given (unbounded) $Q^+$ is a member of $\{q_1, q_2, \ldots\}$ and L contains no more than $2^{mr_0}$ code-vectors.

At step 100, the region is bound to an element in the region wherein the element is the largest element in the region with respect to the norm of the region. Thus, given the threshold norm L, both $Q^+$ and L can be bound to the $n^{th}$ element, where n is the largest i with $l_i$ greater than or equal to L. At step 110 it is then desired to determine $\beta$ for the region as a function of the norm to minimize shape distortion and thereby shape the constellation to achieve the 1.53 dB shaping gain. It is then determined at step 120 whether all of the symbols have been placed in the region and, if not, then at step 130 the method is incremented to the next region and returns to step 70 to process that next region. Otherwise, at step 140 the constellation is shaped based on the determined optimal configuration of regions and the method ends at step 150.

A simulation has been run to test the inventive methods in which a computer generated random sequence of 6.4 million samples was used as the training data for implementing the methods. As the number of code-vectors becomes large, the mD source probability density function p(x) becomes increasingly localized to a region within which the density p(x) is almost uniform. This property justifies the use of a uniform alphabet, Q. FIG. 3A depicts the threshold norm L for an m-sphere or m-pyramid bounded TB-SVQ. The numbers in parentheses are the corresponding SVQ coding redundancy (in bits/sample).

According to FIG. 3A, the threshold norm L is approximately linear or slightly less than linear in the vector dimension m for Laplacian or Gaussian sources, respectively. Thus, decreasing the vector dimension m guarantees loss of some vector quantization gains but can only reduce the coder complexity in an approximately linear manner. By implementing the codebook methods of the present invention, the threshold norm is more effectively reduced while still preserving most of the vector quantizer gains. The norm L for a 3-bits/sample m-pyramid bounded quantizer ($r_0=3$ and $r_1=0$) can be reduced to approximately one-eighth if $r_0=1$ and $r_1=2$ are used instead.

The rate-distortion performance (signal-to-noise ratio (SNR) in dB), complexity (in elapsed time $t_c$), and optimal trellis scale $\beta^*$ of the TB-SVQ are shown in FIGS. 3B (for a coding rate of 2 bits/sample) and 3C (for a coding rate of 3 bits/sample). These tables were generated using the inventive methods to encode ten independently generated random sequences, each having 160,000 samples matched to the source distribution (zero-mean unit-variance Gaussian or Laplacian).

In FIG. 3B, the encoding rate r was 2 bits/sample and the optimal trellis scale $\beta^*$ of the TB-SVQ for three vector dimensions (m=16, 32, 64) and two possible configurations (($r_0, r_1$)=(2, 0) or (1, 1)) was achieved. For Gaussian sources, both configurations had approximately the same SNR performance. Thus, the codebook boundary gain was not sacrificed by signaling of regions. However, there was an exception in the m=32 regime for which the (1, 1) configuration was inferior to the (2, 0) configuration by about 0.18 dB. This is because, according to FIG. 3A, the 32 sphere codebook $r_0$=1 bit/sample has a considerably high coding redundancy of 0.04 bits/sample. For Laplacian sources, both 16D and 32D codebooks at $r_0$=1 bit/sample have even higher coding redundancies. As a result, the (2, 0) configuration outperforms the (1, 1) configuration. When m was increased to 64, the (1, 1) configuration was inferior to the (2, 0) configuration by 0.17 dB. For both sources, the elapsed time, $t_e$ for the (2, 0) configuration is generally more than nine times that for the (1, 1) configuration.

The saving in complexity is more significant as the vector dimension m increases. The inventive methods of signaling of regions allow for 64D (1, 1) configured quantizers while needing a considerably less elapsed time to outperform the 16D (2, 0) configured quantizers by approximately 0.3 dB. FIG. 3C presents similar results for r=3 bits/sample. For Gaussian sources, all configurations for a fixed vector dimension m have approximately the same SNR performance, except for the 32D (1, 2) configuration which has a coding redundancy of 0.04 bits/sample. For Laplacian sources, unless the SVQ coding entails significant coding redundancy, all configurations for a fixed vector dimension m performed equally well. Since the coder complexity depends linearly on the threshold norm L[1, 2], which is fixed for a given vector dimension m and an SVQ shaping rate of $r_0$ bits/sample, as long as m and $r_0$ are fixed the TB-SVQ complexity should be approximately rate-independent.

The inventive methods for reducing the complexity of TB-SVQ greatly reduce the computational complexity of building a codebook for memoryless sources. This allows for optimal constellation shaping and the achievement of substantially the full 1.53 dB shaping gain necessary for efficient data transmission. Such results have not heretofore been achieved in the art.

While there have been shown and described certain fundamental novel features of the present invention as applied to preferred embodiments thereof, it will be understood by those skilled in the art that various omissions and substitutions and changes in the devices and methods described herein, and in their operation, may be made by those skilled in the art without departing from the spirit and scope of the invention. It is expressly intended that all combinations of those elements and/or method steps which perform substantially the same function in substantially the same way to achieve the same result are within the scope of the invention. Substitution of elements from one described embodiment to another are also fully intended and contemplated. It is the intention, therefore, to be limited only as indicated by the scope of the claims appended hereto.

I claim:

1. A method of reducing constellation complexity of a trellis-based scalar-vector quantizer for a memoryless data source in a communication system, comprising the steps of:

defining an unbounded set of reproduction symbols in which neighboring symbols are distanced from each other by a predetermined factor;

grouping the set of said reproduction symbols into a region;

assigning a norm value to the region and determining a threshold norm value for the region;

bounding the region to an element in the region wherein the element is the largest element in the region with respect to the norm of the region; and determining a parameter for the region as a function of the norm of the region which minimizes shape distortion of the region, thereby reducing the complexity of the trellis-based scalar-vector quanitizer for the source and optimally shaping the constellation, wherein the memoryless source is a Gaussian source and the unbounded set of reproduction symbols is denoted as Q and is defined as:

$$Q=\{+/-(2i-1)\beta: i=1, 2, \ldots \},$$

wherein, $\beta$ is a factor that minimizes distortion and is determined by plotting quantizer distortion on encoding zero-mean unit-variance source sequence as a function of $\beta$, and i is a region index.

2. The method of claim 1, wherein the reproduction symbols of the set are grouped as follows:

$$q_i=\{(2((i-1)2^{rl}+j)-1)\beta: j=1, 2, \ldots, 2^{rl}\}, \text{ for } i=1, 2, \ldots, \text{ wherein,}$$

q is the region;

l is the the norm of the region; and r is a quantization rate; and j=1, 2 . . . , $2^{rl}$.

3. The method of claim 2, wherein the quantization rate is 2 bits/sample.

4. The method of claim 2, wherein the quantization rate is 3 bits/sample.

5. The method of claim 4, wherein the constellation is shaped at a shaping gain of about 1.53 dB.

* * * * *